United States Patent

Chiou

[11] Patent Number: 5,982,622
[45] Date of Patent: Nov. 9, 1999

[54] CPU COOLING ARRANGEMENT

[76] Inventor: Ming Chin Chiou, No. 2, Alley 1, Lane 160, Kai De St., Kau Hsiung City, Taiwan

[21] Appl. No.: 09/264,667

[22] Filed: Mar. 9, 1999

[51] Int. Cl.$^6$ .................................................... H05K 7/20
[52] U.S. Cl. ......................... 361/704; 361/704; 361/707; 361/719; 361/720; 257/707; 257/712; 165/80.3; 174/16.3
[58] Field of Search .................................. 361/704, 719, 361/720, 752, 697, 707, 713; 24/453, 628; 165/80.3, 185; 257/706–723; 248/316.7; 174/16.3

[56] References Cited

U.S. PATENT DOCUMENTS 5,761,041  6/1998  Hassanzadeh et al. .................. 361/704
5,856,910  1/1999  Yurchenco et al. ...................... 361/704

Primary Examiner—Leo P. Picard
Assistant Examiner—Michael Datskovsky
Attorney, Agent, or Firm—Bacon & Thomas

[57] ABSTRACT

A CPU cooling arrangement includes a CPU receptacle holding a CPU, a heat sink attached to the CPU in the CPU receptacle, the heat sink having two symmetrical mounting rods respectively inserted through respective through holes at the CPU receptacle, and a retainer plate mounted on the mounting rods at one side of the CPU receptacle opposite to the heat sink and pulled sideways to secure the heat sink and the CPU receptacle together.

1 Claim, 4 Drawing Sheets

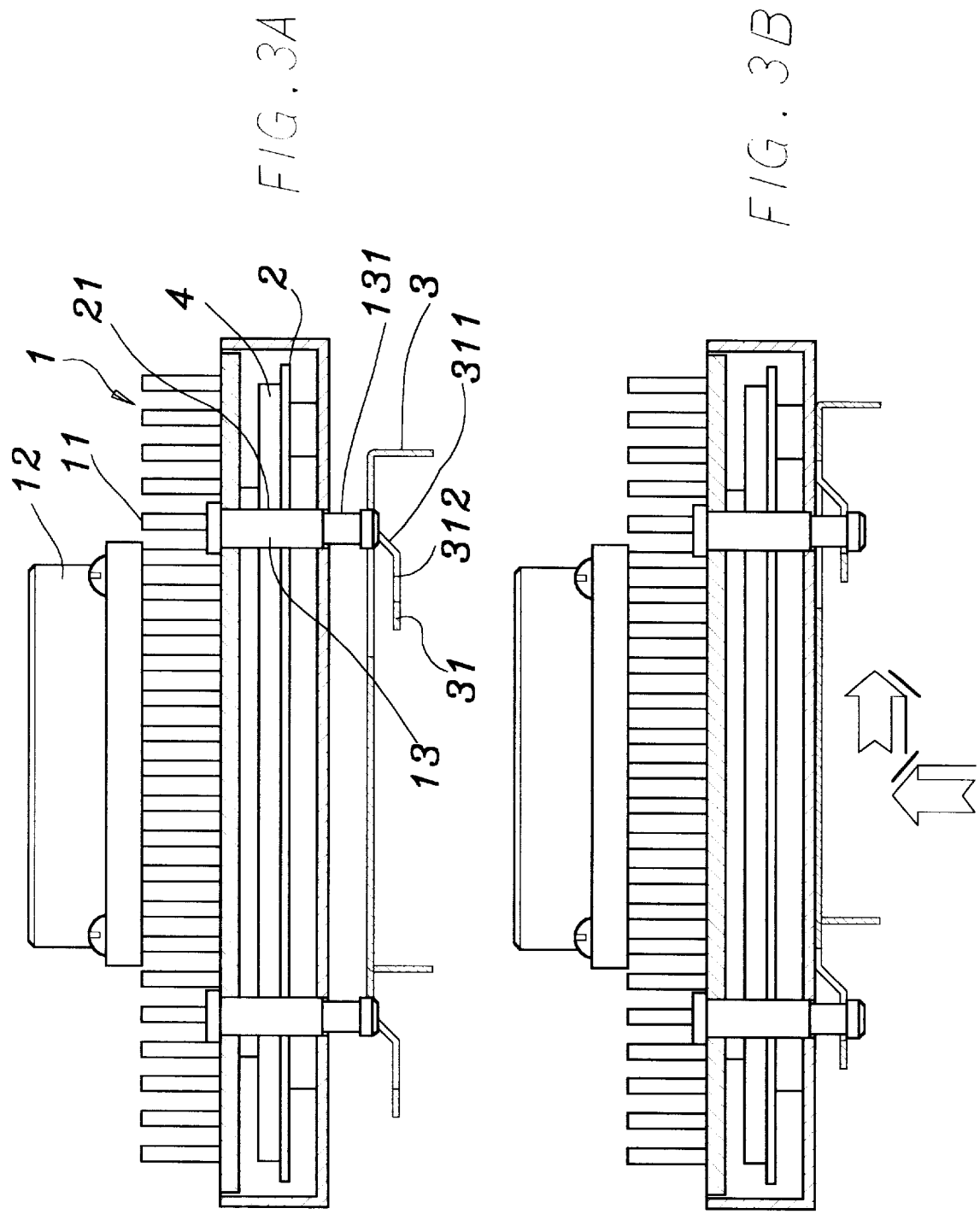

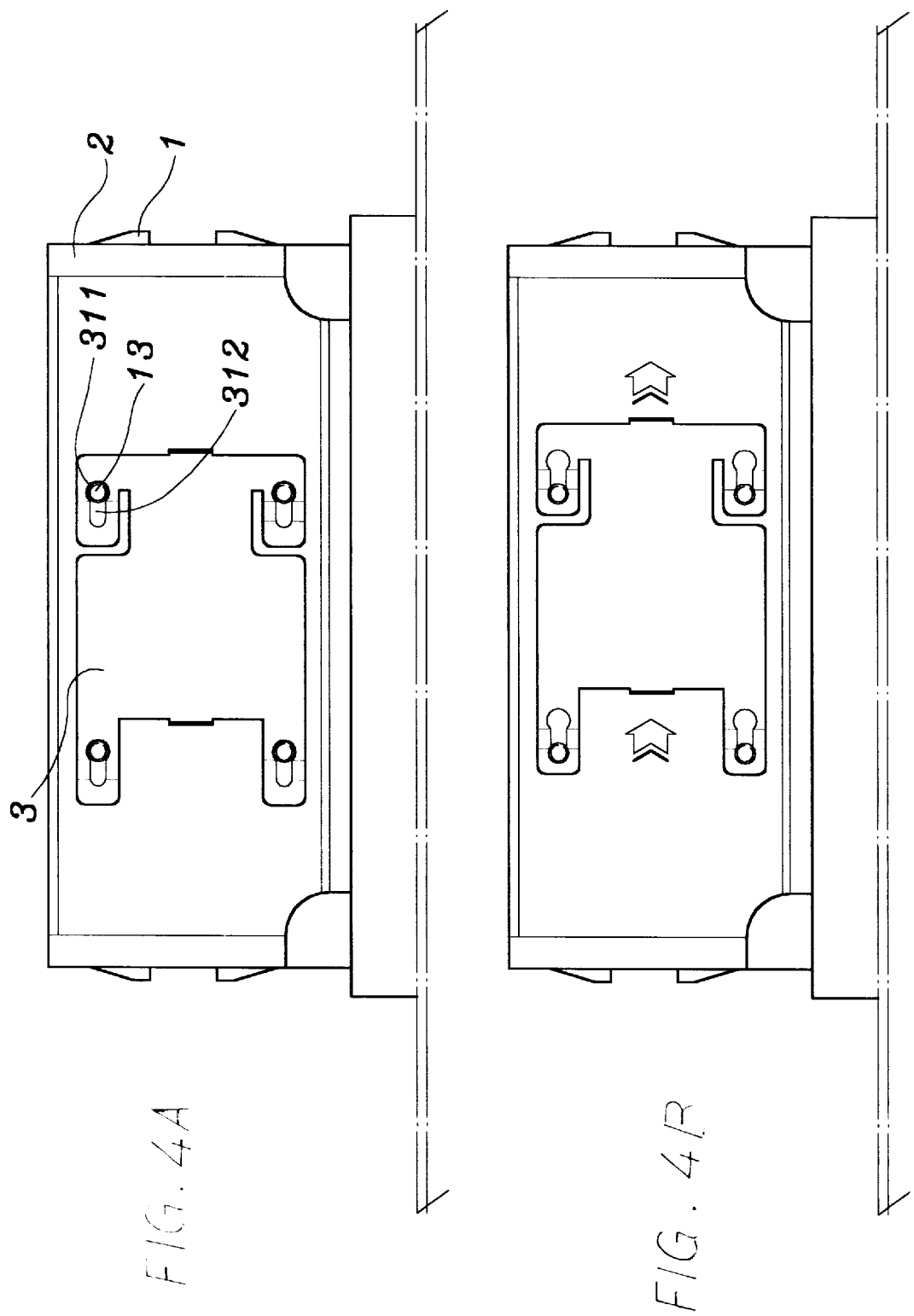

CPU COOLING ARRANGEMENT

BACKGROUND OF THE INVENTION

The present invention relates to a CPU cooling arrangement, in which a retainer plate is attached to the back side of a CPU receptacle to secure a heat sink to the CPU receptacle, enabling the heat sink to be firmly maintained in contact with the CPU in the CPU receptacle.

When the CPU of a computer is operated, it produces much heat. During the operation of the CPU, heat must be quickly carried away. Various heat sinks have been disclosed for use to dissipate heat from a CPU, and have appeared on the market. When a heat sink is attached to a CPU module, or a CPU receptacle which holds a CPU, retainer or fastener means must be used to fix the heat sink and the CPU module or CPU receptacle together.

SUMMARY OF THE INVENTION

The present invention provides a retainer plate for securing a heat sink to a CPU receptacle. The retainer plate comprises four curved, springy retaining lugs in four corners, each retaining lug defining a round hole and a narrow, elongated slot. When the heat sink is attached to the CPU receptacle with its mounting rods respectively inserted through respective through holes at the CPU receptacle, the retaining lugs of the retainer plate are coupled to the mounting rods at one side of the CPU receptacle opposite to the heat sink, permitting the mounting rods to be respectively inserted through the round holes at the retaining lugs, and then the retainer plate is pulled sideways to force the elongated slots of the retaining lugs into engagement with a respective neck at each mounting rods, enabling the heat sink and the retainer plate to be firmly secured together with the CPU receptacle sandwiched in therebetween.

BRIEF DESCRIPTION OF THE DRAWINGS

FIG. 3A is a sectional assembly view of the present invention, showing the mounting rods of the heat sink respectively inserted through the through holes at the CPU receptacle and the round holes at the retaining lugs of the retainer plate.

FIG. 3B is similar to FIG. 3A but showing the retainer plate pulled sideways, the elongated slots of the retaining lugs forced into engagement with the necks at the mounting rods of the heat sink.

FIG. 4A is a back side view of FIG. 3A.

FIG. 4B is a back side view of FIG. 3B.

DETAILED DESCRIPTION OF THE PREFERRED EMBODIMENT

Figure 1:
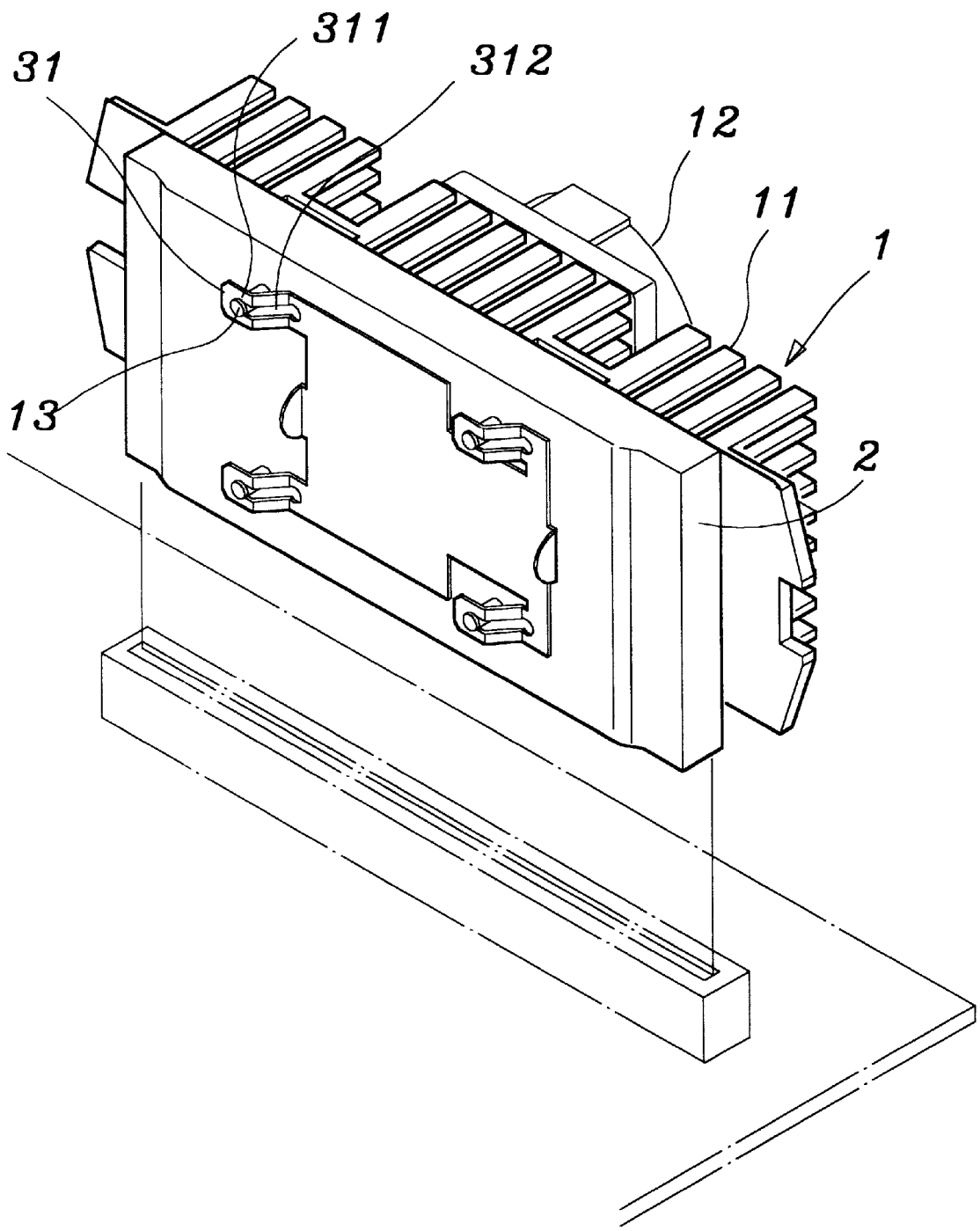
FIG. 1 is an oblique view of a CPU cooling arrangement according to the present invention.
Figure 2:
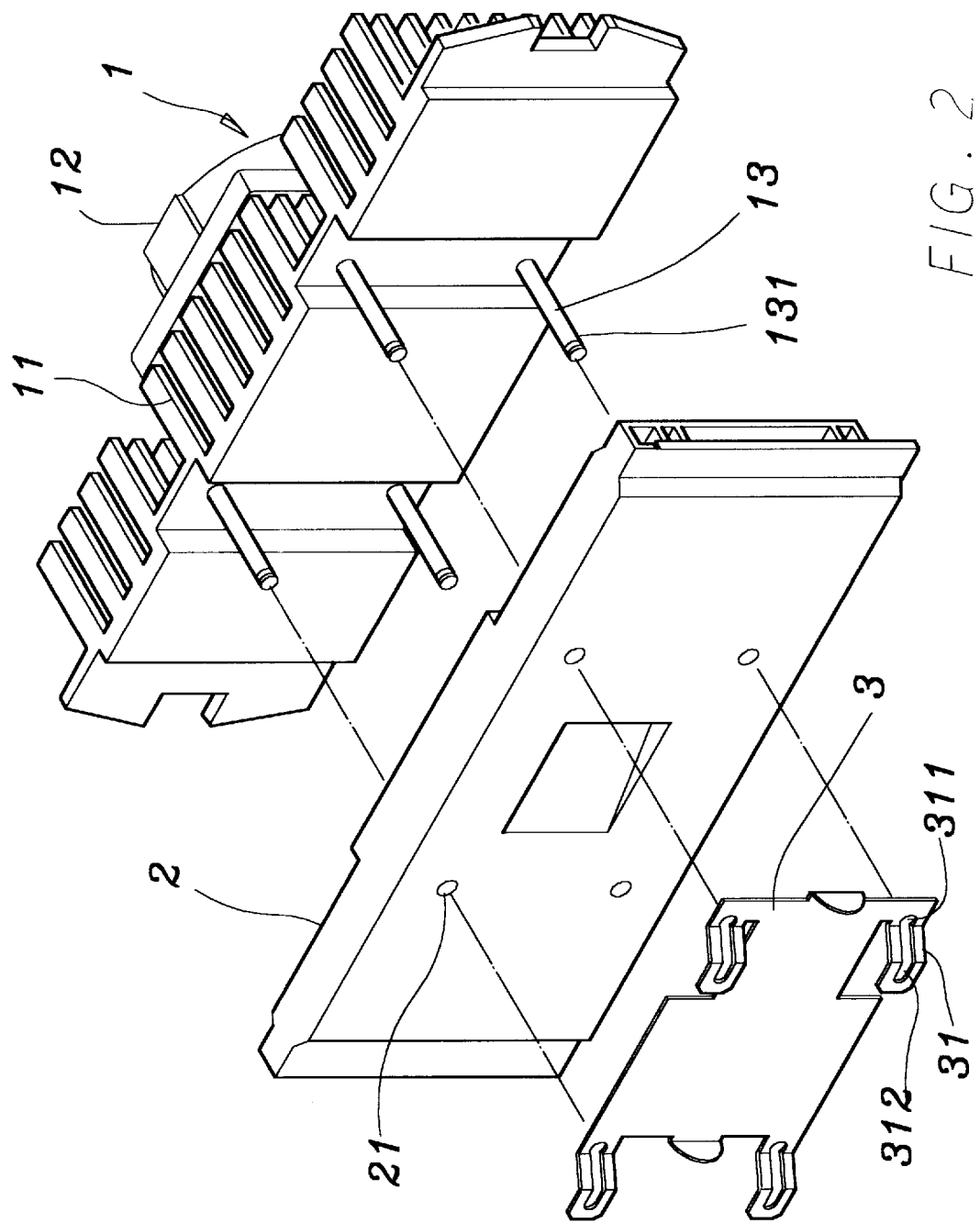
FIG. 2 is an exploded view of the CPU cooling arrangement shown in FIG. 1.

Referring to FIGS. 1 and 2, the present invention comprises a heat sink 1, a flat CPU receptacle 2, and a retainer plate 3. The heat sink 1 comprises a plurality of radiation fins 11 raised from its front side wall on which a fan 12 is mounted, and four mounting rods 13 perpendicularly symmetrically raised from its back side wall. The mounting rods 13 each have a neck 131 at one end remote from the heat sink 1. The CPU receptacle 2 comprises four through holes 21 corresponding to the mounting rods 13 at the heat sink 1. The retainer plate 3 comprises four springy retaining lugs 31 respectively obliquely raised from four corners thereof in one direction and then turned horizontally forwards, each retaining lug 31 defining a round hole 311 and a narrow, elongated slot 312 extended from the round hole 311. The diameter of the round hole 311 is slightly greater than the diameter of the mounting rods 13. The width of the elongated slot 312 is approximately equal to the neck 131 of each mounting rod 13.

Referring to FIGS. 3 and 4, when the mounting rods 13 of the heat sink 1 are respectively inserted through the through holes 21 at the CPU receptacle 2, the heat sink 1 is closely attached to the CPU 4 in the CPU receptacle 2, then the retainer plate 3 is attached to the back side of the CPU receptacle 2 opposite to the heat sink 1, enabling the mounting rods 13 of the heat sink 1 to be respectively inserted through the round holes 311 at the retaining lugs 31 of the retainer plate 3 (see FIGS. 3A and 4A), and then the retainer plate 3 is pulled sideways, enabling the elongated slots 312 of the retaining lugs 31 to be respectively forced into engagement with the necks 131 of the mounting rods 13 (see FIGS. 3B and 4B), and therefore the retainer plate 3 is fixed to the mounting rods 13 to secure the heat sink 1 and the CPU receptacle 2 firmly together. When removing the retainer plate 3 from the CPU receptacle 2 and the heat sink 1, the aforesaid procedures are repeated reversely.

What the invention claimed is:

1. A CPU cooling arrangement comprising a CPU receptacle holding a CPU, a heat sink fastened to said CPU receptacle and maintained in contact with the CPU in said CPU receptacle, and a retainer plate attached to said CPU receptacle at one side opposite to said heat sink to secure said heat sink and said CPU receptacle together, wherein:

said CPU receptacle comprises four symmetrical through holes;

said heat sink comprises four mounting rods perpendicularly symmetrically raised from a back side wall thereof and respectively inserted through the through holes at said CPU receptacle, said mounting rods each having a neck at one end remote from said heat sink;

said retainer plate comprises four springy retaining lugs respectively obliquely raised from four corners thereof in one direction and turned horizontally forwards and respectively coupled to said mounting rods of said heat sink to secure said heat sink to said CPU receptacle, said retaining lugs each comprising a round hole through which said mounting rods of said heat sink are respectively inserted, and a narrow, elongated slot extended from said round hole and respectively forced into engagement with the necks of said mounting rods upon a sideways movement of said retainer plate relative to said CPU receptacle after said mounting rods have been respectively inserted through the round holes at said retaining lugs.

* * * * *